(12) United States Patent
Zhang et al.

(10) Patent No.: US 11,735,804 B2
(45) Date of Patent: Aug. 22, 2023

(54) MULTI-CORE BROADBAND PCB ANTENNA

(71) Applicant: QUALCOMM Incorporated, San Diego, CA (US)

(72) Inventors: Chaoqi Zhang, San Diego, CA (US); Suhyung Hwang, Rancho Mission Viejo, CA (US); Jaehyun Yeon, San Diego, CA (US); Taesik Yang, San Diego, CA (US); Jeongil Jay Kim, San Diego, CA (US); Darryl Sheldon Jessie, San Diego, CA (US); Mohammad Ali Tassoudji, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 196 days.

(21) Appl. No.: 16/871,822

(22) Filed: May 11, 2020

(65) Prior Publication Data
US 2021/0351488 A1 Nov. 11, 2021

(51) Int. Cl.
*H01Q 1/38* (2006.01)
*H01Q 1/12* (2006.01)
*H05K 1/02* (2006.01)
*H05K 3/00* (2006.01)
*H05K 3/46* (2006.01)

(52) U.S. Cl.
CPC ............ *H01Q 1/12* (2013.01); *H05K 1/0243* (2013.01); *H05K 3/0047* (2013.01); *H05K 3/4644* (2013.01); *H05K 2201/10098* (2013.01)

(58) Field of Classification Search
CPC .... H01Q 1/12–38; H05K 1/0243; H05K 3/46; H05K 2201/10098
See application file for complete search history.

(56) References Cited

U.S. PATENT DOCUMENTS

| | | | | |
|---|---|---|---|---|
| 7,079,079 | B2* | 7/2006 | Jo | H01Q 9/0421 343/702 |
| 8,304,878 | B2* | 11/2012 | Appelt | H05K 1/186 438/109 |
| 10,128,177 | B2* | 11/2018 | Kamgaing | H01L 23/49827 |
| 10,741,906 | B2 | 8/2020 | Gomez et al. | |
| 2012/0280380 | A1* | 11/2012 | Kamgaing | H01Q 21/0093 343/893 |
| 2014/0145883 | A1* | 5/2014 | Baks | H01L 23/66 343/700 MS |
| 2015/0223320 | A1* | 8/2015 | Gerhau er | H01L 21/486 29/832 |

(Continued)

*Primary Examiner* — Hasan Islam
(74) *Attorney, Agent, or Firm* — Patterson + Sheridan, LLP

(57) ABSTRACT

A multi-core broadband printed circuit board (PCB) antenna and methods for fabricating such an antenna are provided. One example antenna implemented with a multi-core PCB generally includes a first core structure, a second core structure disposed above the first core structure, and one or more metal layers disposed above the second core structure or below the first core structure. The first core structure includes a first core layer, a first metal layer disposed below the first core layer, and a second metal layer disposed above the first core layer. The second core structure includes a second core layer, a third metal layer disposed below the second core layer, and a fourth metal layer disposed above the second core layer. The first core layer and the second core layer may have different thicknesses.

20 Claims, 7 Drawing Sheets

(56) References Cited

U.S. PATENT DOCUMENTS

| | | | |
|---|---|---|---|
| 2019/0139912 A1* | 5/2019 | Kim | H01L 21/4853 |
| 2019/0139915 A1* | 5/2019 | Dalmia | H01L 23/5383 |
| 2019/0165449 A1* | 5/2019 | Kim | H01Q 5/335 |
| 2020/0136233 A1* | 4/2020 | Lin | H05K 1/144 |
| 2020/0161766 A1* | 5/2020 | Liu | H01Q 9/045 |
| 2020/0178389 A1* | 6/2020 | Min | H01Q 9/0414 |
| 2020/0373655 A1* | 11/2020 | Takayama | H01Q 9/0407 |
| 2021/0194111 A1* | 6/2021 | Weis | H04B 1/04 |

\* cited by examiner

MULTI-CORE BROADBAND PCB ANTENNA

BACKGROUND

Field of the Disclosure

Certain aspects of the present disclosure generally relate to electronic components and, more particularly, to an antenna implemented with a multi-core printed circuit board (PCB).

Description of Related Art

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more antennas for transmitting and/or receiving radio frequency (RF) signals.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include decreased manufacturing and material cost and better circuit board antenna design flexibility.

Certain aspects of the present disclosure generally relate to a multi-core printed circuit board (PCB) antenna and techniques for fabricating such an antenna.

Certain aspects of the present disclosure are directed to an antenna implemented with a multi-core PCB structure. The antenna generally includes a first core structure comprising a first core layer, a first metal layer disposed below the first core layer, and a second metal layer disposed above the first core layer. The antenna also generally includes a second core structure disposed above the first core structure and including a second core layer, a third metal layer disposed below the second core layer, and a fourth metal layer disposed above the second core layer. The first core layer and the second core layer have different thicknesses. Additionally, the antenna generally includes one or more metal layers disposed above the second core structure or below the first core structure.

Certain aspects of the present disclosure are directed to a wireless device. The wireless device generally includes the antenna as described herein and a radio frequency front-end coupled to the antenna.

Certain aspects of the present disclosure are directed to a method of fabricating an antenna implemented with a multi-core PCB. The method generally includes forming a first core structure, which includes a first core layer, a first metal layer disposed below the first core layer, and a second metal layer disposed above the first core layer. The method also generally includes forming a second core structure, which includes a second core layer, a third metal layer disposed below the second core layer, and a fourth metal layer disposed above the second core layer. The first core layer and the second core layer have different thicknesses. The method further includes disposing the second core structure above the first core structure and disposing one or more metal layers above the second core structure or below the first core structure.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide a multi-core broadband printed circuit board (PCB) antenna and techniques for fabricating the same. Such a multi-core PCB antenna may provide decreased manufacturing and/or material costs, as well as increased antenna stacking flexibility.

Example Device for Inclusion of a Multi-Core PCB Broadband Antenna

Figure 1:
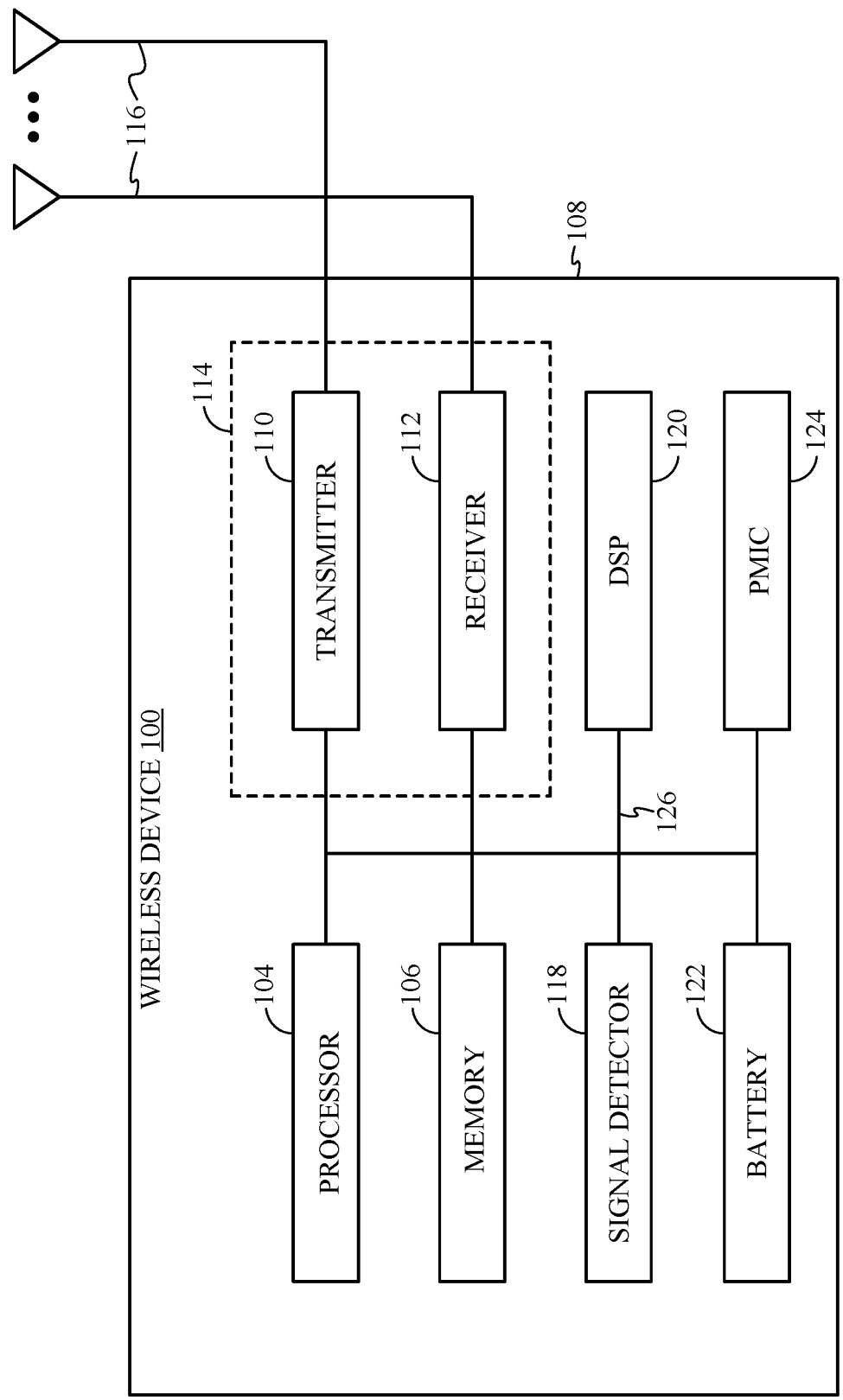
FIG. 1 illustrates a block diagram of an example device, in accordance with certain aspects of the present disclosure.

FIG. 1 illustrates an example device 100 in which aspects of the present disclosure may be implemented. The device 100 may be a battery-operated device such as a cellular phone, a personal digital assistant (PDA), a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. For certain aspects, one or more of the antennas 116 may be implemented with a multi-core broadband PCB antenna, as described herein. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include a battery charging circuit (e.g., a master-slave battery charging circuit) or other switched-mode power supply (SNIPS). The various components of the device 100 may be coupled together by a bus system 126, which may include a power bus, a control signal bus, and/or a status signal bus in addition to a data bus.

Example Broadband Antenna Based on Package Substrate Technology

As described above, a device (e.g., device 100) may include one or more antennas (e.g., antennas 116) to support wireless communications. Conventional millimeter wave (mmWave) antenna modules are typically designed based on package substrate technology.

Figure 2A:
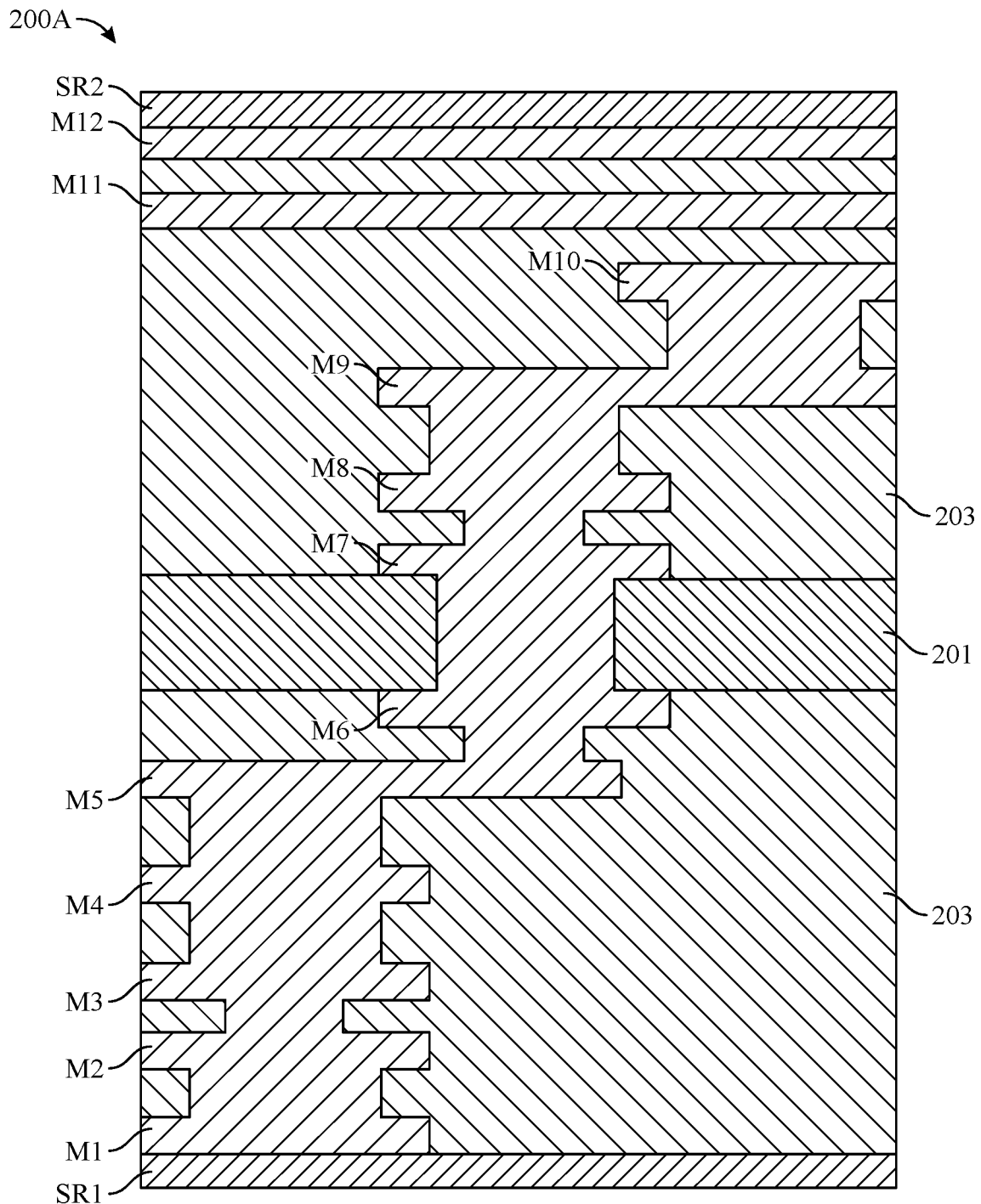
FIG. 2A is a cross-sectional view of an example multi-layer printed circuit board (PCB) antenna design with a single core.

FIG. 2A is a cross-sectional view of an example antenna 200A based on package substrate technology with a single core. As depicted, the antenna 200A may include a core 201, multiple metal layers M1-M12 interposed between electrically insulative layers 203, and solder resist layers SR1 and SR2. The core 201 may be disposed in the middle of the layer stack-up, such as between metal layers M6 and M7. In this manner, the layer stack-up for the antenna 200A is symmetrical, with six metal layers (M1-M6) disposed below the core 201 and six metal layers (M7-12) disposed above the core. This symmetrical design prevents warpage of the circuit board and the potential electrical issues (e.g., open circuits) associated therewith. The electrically insulative layers 203 may comprise pre-impregnated material (referred to as "prepreg" or "PPG"), for example. The metal layers M1-M12 may have thicknesses ranging between 15 and 20 nm, for example. Vias may intersect the core 201 and the electrically insulative layers 203 and may be used to couple adjacent metal layers, as depicted. Solder resist layer SR1 may be disposed at the bottom of the antenna 200A and used to cover metal layer M1, and solder resist layer SR2 may be disposed at the top of the antenna 200A and used to cover metal layer 12. Each of the solder resist layers SR1, SR2 may have a thickness of 15 nm, for example.

However, current package antenna designs (such as the antenna 200A) may be costly to produce, incur a long lead time, and have general design inflexibility. Broadband mmWave antenna designs may implement asymmetric layers with specific vertical layer-to-layer distances. However, package substrate technology is generally limited to be a symmetric stack-up, single-core structure with thin dielectric layers. To achieve this symmetry, multiple dummy layers may be added to the stack-up, which may significantly increase the cost and manufacturing time of the antenna module. For example, although antenna 200A includes twelve metal layers (M1-M12), only a portion of these layers (e.g., six layers) may actually be utilized for the desired broadband antenna design; the rest of the layers may be dummy layers used to achieve symmetry of the layer stack-up around the single core 201 and to achieve the various relative heights of the metal layers to implement the desired antenna design.

Example Multi-Core Broadband PCB Antenna

Accordingly, certain aspects of the present disclosure provide a multi-core PCB antenna for increasing antenna design flexibility and reducing manufacturing cost, compared to conventional broadband antenna designs. The multi-core PCB antenna described herein may replace the dummy layers with PCB core layers to reduce the cost and lead time of 5G mmWave antenna module fabrication. In certain aspects, a multi-core PCB stack-up can mitigate the warpage risk with a thicker, high modulus core layer. Furthermore, an asymmetric structure for antenna design may provide better design flexibility.

Figure 2B:
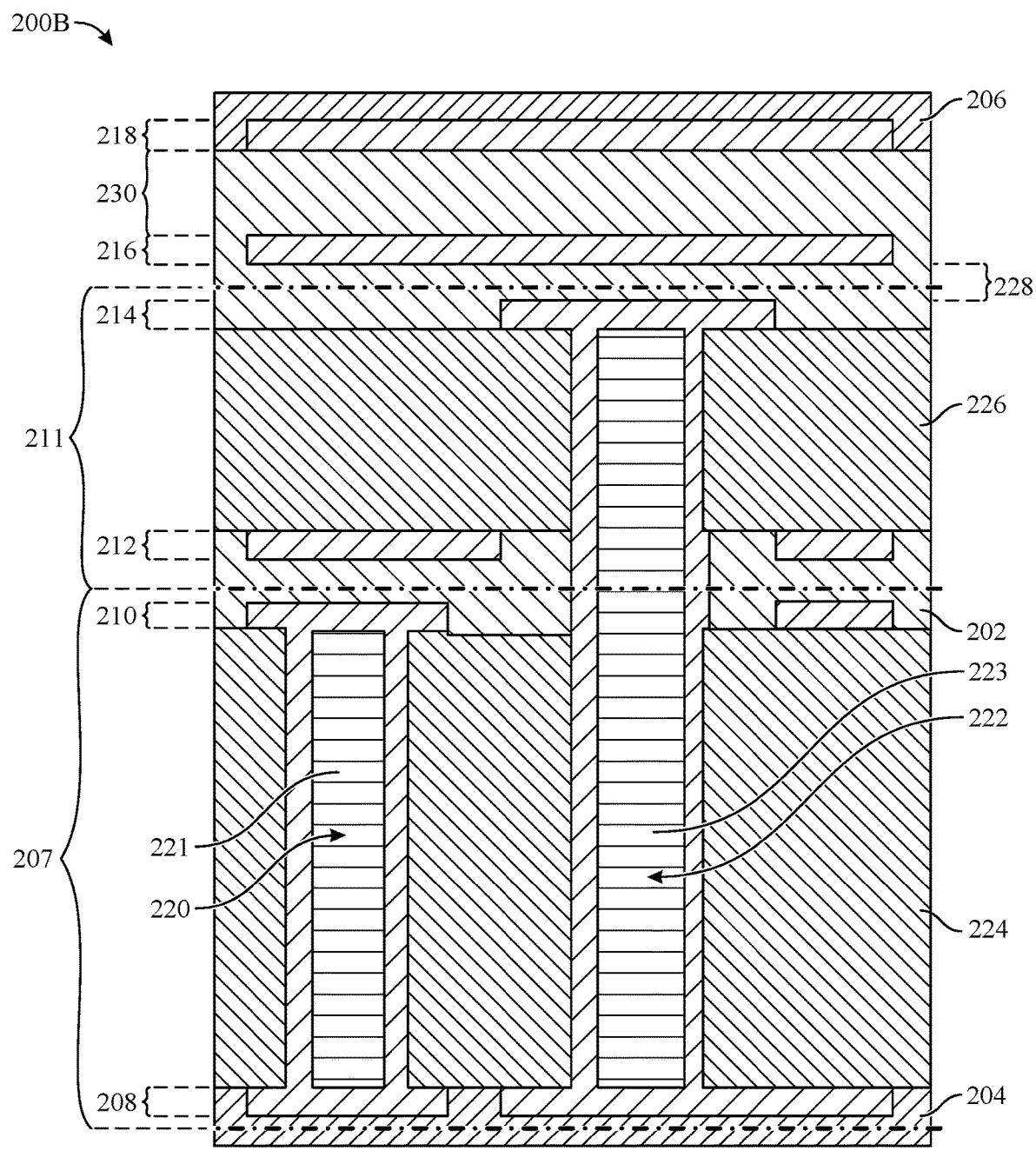
FIG. 2B is a cross-sectional view of an example multi-core PCB antenna design, in accordance with certain aspects of the present disclosure.

FIG. 2B is a cross-sectional view of an antenna 200B implemented with a multi-core PCB, in accordance with certain aspects of the present disclosure. As shown, the antenna 200B may include multiple cores, a plurality of metal layers, prepreg material, and solder resist. For example, the antenna 200B may comprise a first core structure 207, a second core structure 211 disposed above the first core structure 207, and one or more metal layers disposed above the second core structure 211.

Specifically, the antenna 200B may include six metal layers 208, 210, 212, 214, 216, and 218, as shown. It should be noted that the antenna 200B may have fewer metal layers than the antenna 200A of FIG. 2A, even though antenna 200B may be a substitute for and have performance characteristics at least as good as antenna 200A. Although six metal layers are shown in FIG. 2B, it is to be understood that an antenna in accordance with the present disclosure may have more or less than six total metal layers. Each of the metal layers 208, 210, 212, 214, 216, and 218 depicted may have a thickness ranging between 15 and 20 nm, for example. Each of the metal layers 208, 210, 212, 214, 216, and 218 may include at least one trace, which may comprise copper (Cu) or any other suitable electrically conductive material.

The first core structure 207 may include a core 224. The metal layer 208 may be disposed below the core 224, and the metal layer 210 may be disposed above the core 224. Similarly, the second core structure 211 may include a core 226. The metal layer 212 may be disposed below the core 226, and the metal layer 214 may be disposed above the core 226. For certain aspects, one or more of the metal layers may be disposed directly adjacent to the core of the corresponding core structure. Serving as a reinforcing material in each core structure, the cores 224, 226 may comprise any of various suitable electrically insulative materials, which may be rigid or flexible. The reinforcing material (also referred to as "prepreg") may comprise glass fiber or wood pulp paper, for example, which may be soaked in resin (e.g., FR4). In certain aspects, either or both of the core structures 207, 211 may comprise a copper clad laminate (CCL), where copper clad or foil is laminated to the reinforcing material of the core layer. Either or both sides of each of the core structures 207, 211 may be covered with an electrically insulative material (e.g., an oxide material or solder resist), such as electrically insulative layers 202 and 228, The core structures 207, 211 may be bonded together through any of various suitable means for attaching one core structure to another.

The thickness of each of the cores 224, 226 may be based on the desired structure and performance for the antenna 200B. The cores 224, 226 may have the same or different thicknesses. For example, the core 224 may have a thickness of about 500 nm, and the core 226 may have a thickness of about 175 nm. Although two cores 224, 226 are illustrated in FIG. 2B, it is to be understood that a multi-core PCB antenna in accordance with the present disclosure may have more than two cores.

As illustrated in FIG. 2B, two metal layers 216, 218 are disposed above the second core structure 211. Depending on the desired antenna design, there may be zero, one, two, or more than two metal layers disposed above the multi-core stack structure (e.g., composed of the first and second core structures 207, 211). Additionally or alternatively, there may be zero, one, or more metal layers disposed below the multi-core stack. In this manner and with the support of the multiple cores, the layer stack-up of the multi-core PCB may be asymmetrical, as illustrated in the example of FIG. 2B. It should also be noted that dummy layers need not be included in the antenna 200B, unlike with the symmetrical antenna design of FIG. 2A. The metal layers above and/or below the multi-core stack structure may be laminated one above another during fabrication, thereby creating an electrically insulative layer 230 between each pair of adjacent metal layers (e.g., layers 216, 218).

A multi-core PCB antenna may include one or more drill holes, which may be used to form one or more vias across one or more core structures, electrically connecting two metal layers together. As illustrated in FIG. 2B, the antenna 200B includes two drill holes 220 and 222. The drill hole 220 may span the height of the core 224 and may be plated with a conductive material, such as copper. In this manner, the drill hole 220 may function as a via coupling the metal layer 208 to the metal layer 210, as shown. For certain aspects, the drill hole 220 may include a dielectric ink 221 disposed therein (e.g., by injection). The drill hole 222 may extend from the metal layer 208 to the metal layer 214, extending beyond the heights of the cores 224, 226. Thus, the drill hole 222 is taller than the drill hole 220. For certain aspects, the drill hole 222 may include a dielectric ink 223 disposed therein (e.g., by injection). It should be noted that the antenna 200B has more cores than the antenna 200A of FIG. 2A.

The antenna 200B may also include a bottom solder resist layer 204 disposed beneath the bottommost metal layer (e.g., metal layer 208 in FIG. 2B) of the antenna and a top solder resist layer 206 disposed above the topmost metal layer (e.g., metal layer 218 in FIG. 2B) of the antenna. In certain aspects, the solder resist layers 204, 206 may have a thickness of about 15 nm.

Example Fabrication of a Multi-Core PCB Antenna

FIGS. 3A-3F are cross-sectional views of example operations for fabricating an antenna implemented by a multi-core PCB, in accordance with certain aspects of the present disclosure.

Figure 3A:
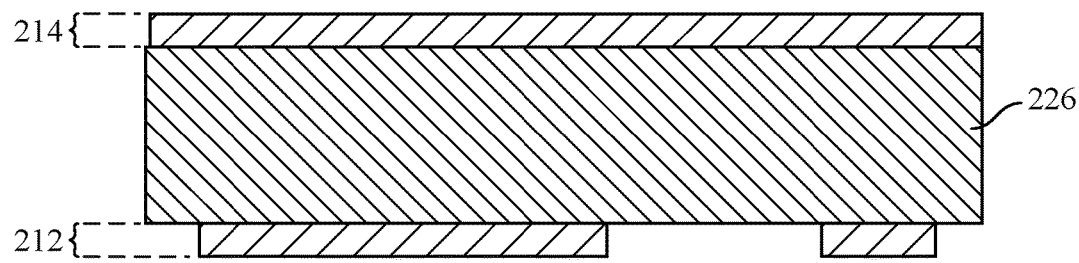
FIGS. 3A-3F are cross-sectional views of example operations for fabricating a multi-core PCB antenna, in accordance with certain aspects of the present disclosure.

As shown in FIG. 3A, the core structure 211 may be fabricated. For example, the core 226 may be formed using a reinforcing material, as described above. The metal layer 214 may be formed below the core 226, and the metal layer 212 may be formed above the core 226. To form either or both of the metal layers 212, 214, an electrically conductive cladding or film may be attached (e.g., laminated) to the surfaces of the core 226. After attachment, the electrical conductive cladding or film may be patterned (e.g., via etching) to form the conductive traces and planes of the metal layers 212, 214, according to the antenna design. For certain aspects, either or both metal layers 212, 214 may be only partially patterned at this stage. For example, as illustrated in FIG. 3A, the metal layer 212 has been patterned, but the metal layer 214 has not yet been patterned.

Figure 3B:
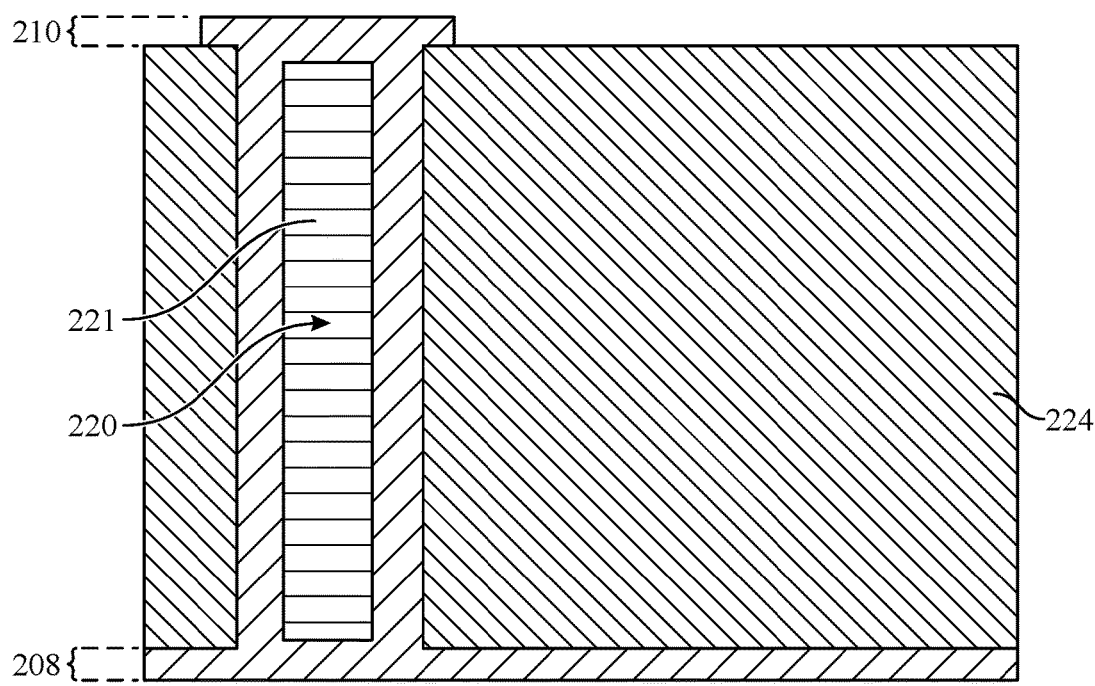

Before, after, or concurrently with the fabrication of the core structure 211, the core structure 207 may be fabricated, as shown in FIG. 3B. For example, the core 224 may be formed in a similar or different manner and with similar or different materials than the core 226. Then, the metal layer 210 may be formed above the core 224, and the metal layer 208 may be formed below the core 224. For certain aspects, the metal layers 208, 210 may be formed, or at least partially formed, by patterning (e.g., etching), as described above. At this stage, the drill hole 220 may be drilled within the core 224, the drill hole 220 may be plated with an electrically conductive material (e.g., Cu), and a dielectric ink 221 or other filler material may be added (e.g., injected) into the drill hole 220.

Figure 3C:
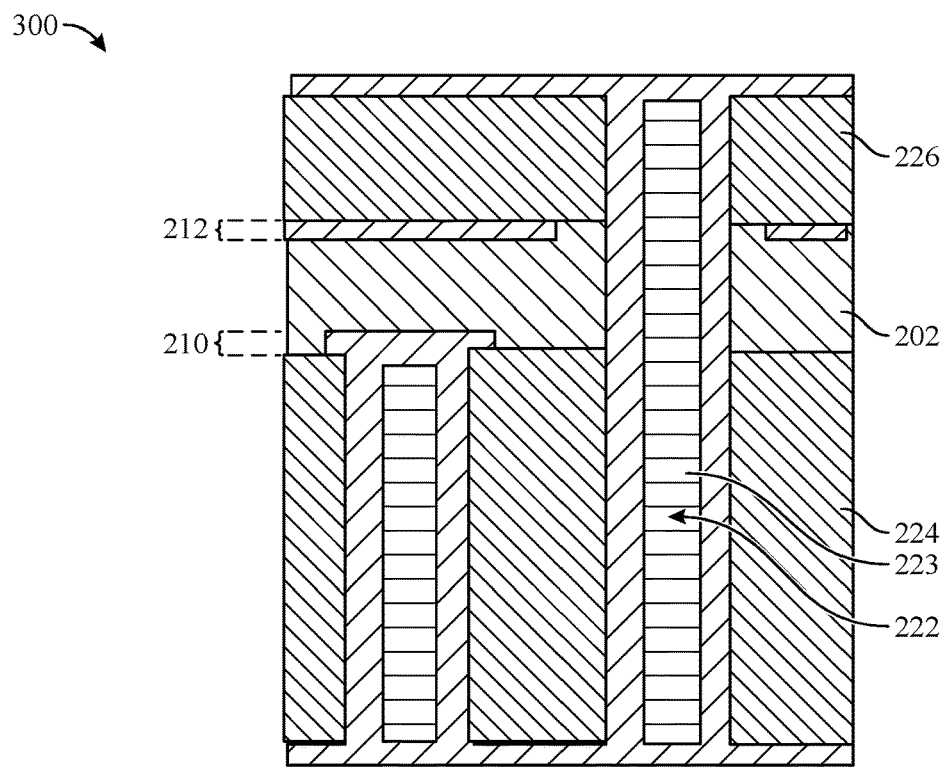

Regarding FIG. 3C, the first and second core structures 207, 211 may be attached (e.g., by bonding together with any suitable material) to form workpiece 300. After attaching the core structures 207, 211 together, the drill hole 222 may be drilled through both core structures, including through the heights of both cores 224, 226. In certain aspects, the drill hole 222 may be plated with an electrically conductive material (e.g., Cu), and a dielectric ink 223 or other filler material may be added (e.g., injected) into the drill hole 222.

Figure 3D:
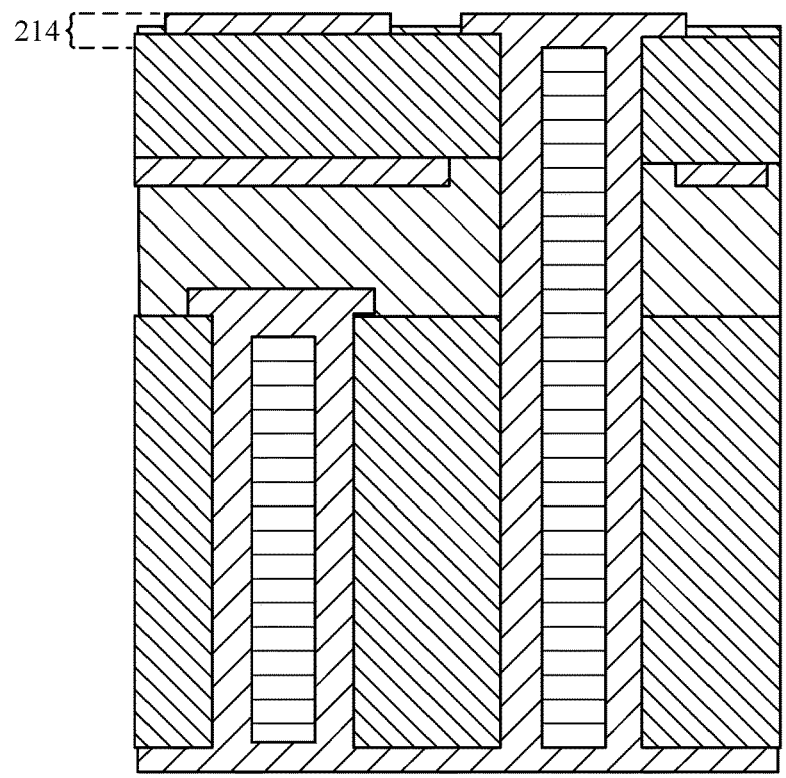

As shown in FIG. 3D, the metal layer 214 may be patterned (e.g., via etching), for example, to form traces and/or planes in the electrically conductive material applied to the core 226.

Figure 3E:
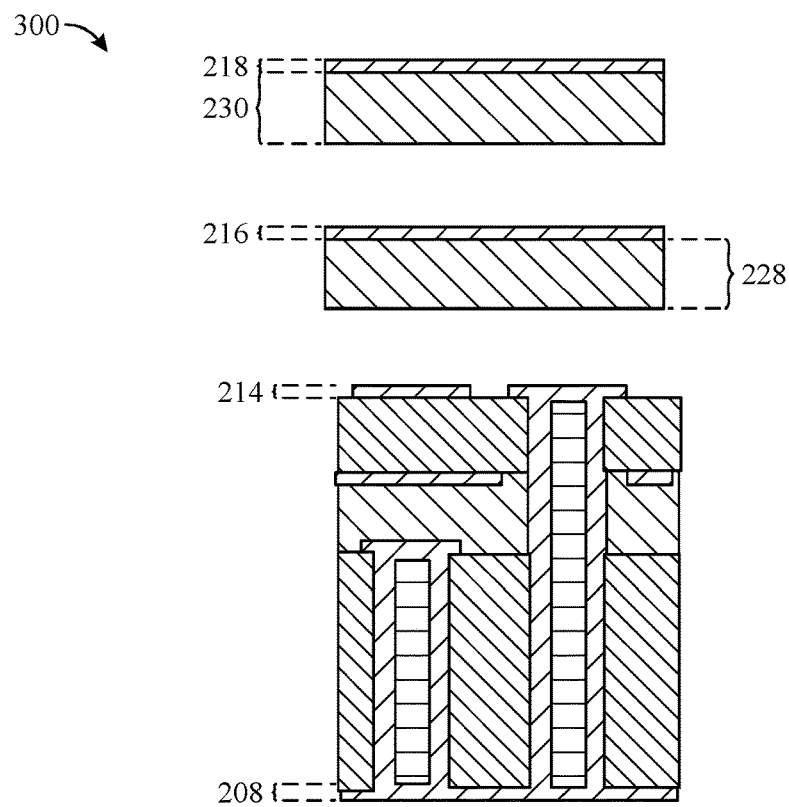

As depicted in FIG. 3E, one or more metal layers may be disposed above the workpiece 300. For example, the metal layer 216 may be attached (e.g., laminated) above the metal layer 214 of the core structure 211, leaving the electrically insulative layer 228 (e.g., of the laminate material) between the metal layers 214, 216. Additionally, the metal layer 218 may be attached (e.g., laminated) above the metal layer 216, leaving the electrically insulative layer 230 (e.g., of the laminate material) between the metal layers 216, 218. In certain aspects, additional metal layers may be laminated or otherwise attached above the metal layer of the topmost core structure (e.g., the metal layer 218 of the core structure 211). Alternatively, zero or only one metal layer (e.g., the metal layer 216) may be laminated above the metal layer 214. In certain aspects, at least one metal layer may be laminated or otherwise attached below the metal layer of the bottommost core structure (e.g., the metal layer 208 of the core structure 207).

Figure 3F:
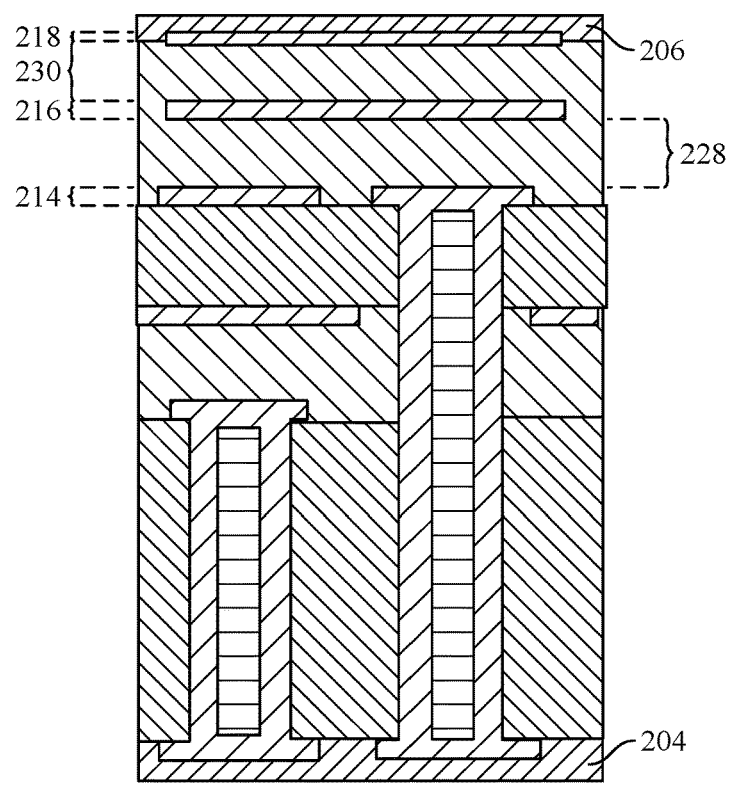

In FIG. 3F, the metal layers 216 and 218 may be patterned (e.g., etched). Furthermore, solder resist layers 204 and 206 may be formed on the top and bottom, respectively, of the workpiece 300, thereby forming the antenna 200B.

Figure 4:
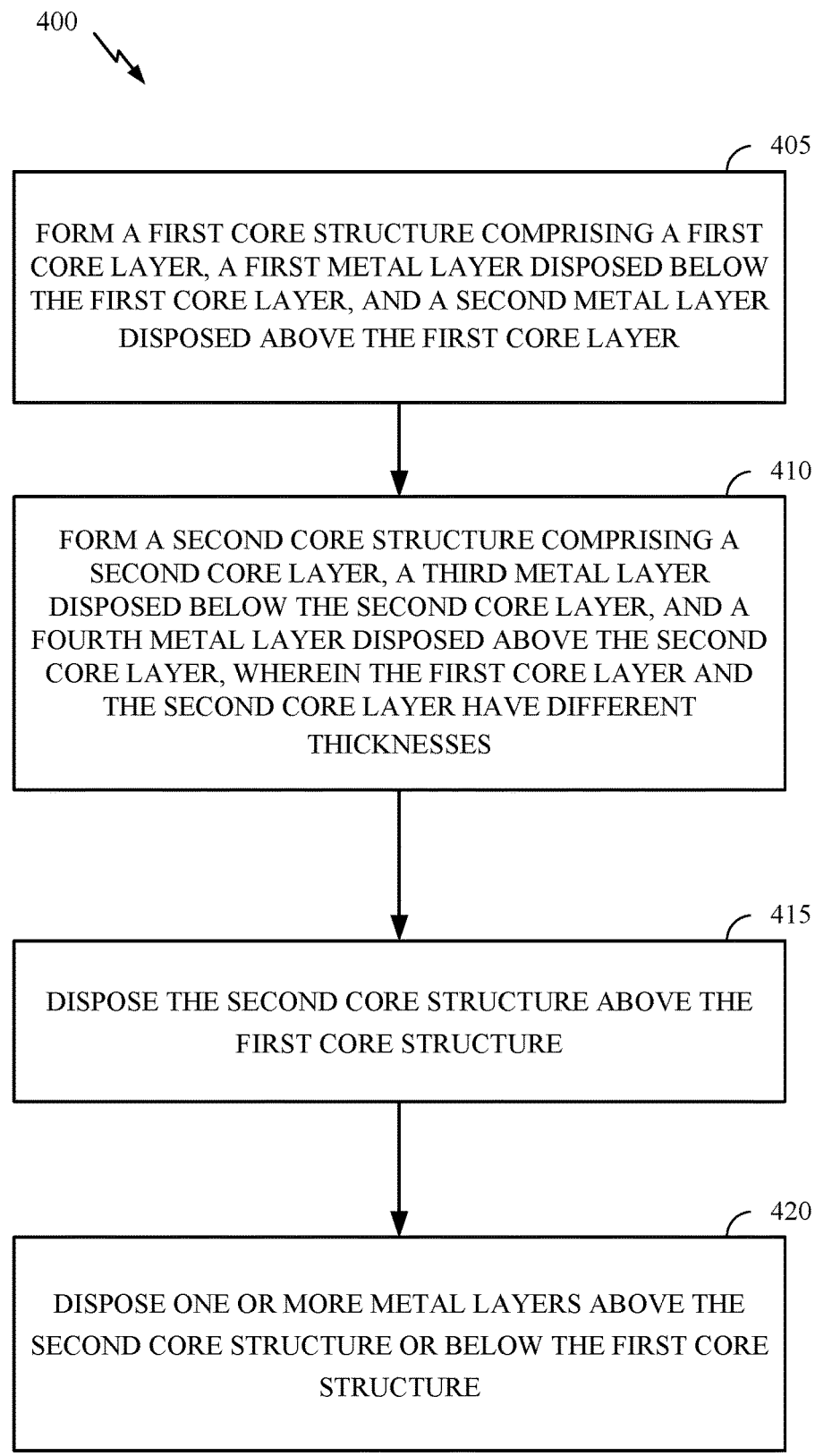
FIG. 4 is a flow diagram of example operations for fabricating an antenna implemented with a multi-core PCB, in accordance with certain aspects of the present disclosure.

FIG. 4 is a flow diagram of example operations 400 for fabricating an antenna (e.g., the antenna 200B depicted in FIG. 2B) implemented in a multi-core PCB, in accordance with certain aspects of the present disclosure. The operations 400 may be performed by a PCB manufacturing facility, for example.

The operations 400 may begin at block 405, where the facility forms a first core structure (e.g., the first core structure 207). The first core structure generally includes a first core layer (e.g., the core 224), a first metal layer (e.g., the metal layer 208) disposed below the first core layer, and a second metal layer (e.g., the metal layer 210) disposed above the first core layer.

Referring to block 410, the facility may form a second core structure (e.g., the second core structure 211). The second core structure generally includes a second core layer (e.g., the core 226), a third metal layer (e.g., the metal layer 212) disposed below the second core layer, and a fourth metal layer (e.g., the metal layer 214) disposed above the second core layer. In certain aspects, the first core layer and the second core layer have different thicknesses (e.g., as illustrated in FIG. 2B).

At block 415, the facility disposes the second core structure above the first core structure. In certain aspects, the disposing at block 415 involves bonding the second core structure to the first core structure.

At block 420, the facility disposes one or more metal layers (e.g., the metal layers 216 and/or 218) above the second core structure or below the first core structure. In certain aspects, a fifth metal layer (e.g., the metal layer 216) is laminated above the second core structure, and a sixth metal layer (e.g., the metal layer 218) is laminated above the fifth metal layer.

According to certain aspects, a layer stack-up of the multi-core PCB is asymmetrical.

According to certain aspects, the operations 400 may further involve the facility drilling a first drill hole (e.g., the drill hole 220) through the first core layer. In this case, the fabrication facility may also drill a second drill hole (e.g., the drill hole 222) through the first core layer and the second core, for example, after disposing the second core structure above the first core structure. For certain aspects, the operations 400 may further entail the facility filling at least one of the first drill hole or the second drill hole with a dielectric ink (e.g., the dielectric ink 221 and/or 223).

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An antenna implemented with a multi-core printed circuit board (PCB) structure, the antenna comprising:
    a first core structure comprising a first core layer, a first metal layer disposed below the first core layer, and a second metal layer disposed above the first core layer;
    a second core structure disposed above the first core structure and comprising a second core layer, a third metal layer disposed below the second core layer, and a fourth metal layer disposed above the second core layer, wherein each of the first core layer and the second core layer is a single electrically insulative layer and wherein the first core layer and the second core layer have different thicknesses; and
    one or more additional metal layers disposed above the second core structure, wherein the antenna is configured to at least one of transmit or receive signals.

2. The antenna of claim 1, wherein a layer stack-up of the multi-core PCB structure is asymmetrical with respect to a horizontal axis through the center of the layer stack-up, the layer stack-up being a cross-section of all layers of the multi-core PCB structure.

3. The antenna of claim 1, wherein the thicknesses of the first and second core layers set one or more performance characteristics of the antenna.

4. The antenna of claim 1, wherein at least one of the first core structure or the second core structure comprises a copper clad laminate.

5. The antenna of claim 1, wherein the one or more additional metal layers comprise a fifth metal layer disposed above the second core structure.

6. The antenna of claim 5, wherein the one or more additional metal layers further comprise a sixth metal layer disposed above the fifth metal layer.

7. The antenna of claim 6, wherein the fifth metal layer is laminated to the second core structure and wherein the sixth metal layer is laminated to the fifth metal layer.

8. The antenna of claim 1, further comprising a first drill hole through the first core layer.

9. The antenna of claim 8, further comprising a second drill hole through the first core layer and the second core layer.

10. The antenna of claim 9, wherein at least one of the first drill hole or the second drill hole is filled with a dielectric ink.

11. The antenna of claim 1, wherein no metal layer is laminated below the first core structure.

12. The antenna of claim 1, wherein the second core structure is bonded to the first core structure with a bonding material.

13. A wireless device comprising the antenna of claim 1, the wireless device further comprising a radio frequency front-end coupled to the antenna.

14. A method of fabricating an antenna implemented with a multi-core printed circuit board (PCB) structure, the method comprising:
    forming a first core structure comprising a first core layer, a first metal layer disposed below the first core layer, and a second metal layer disposed above the first core layer;
    forming a second core structure comprising a second core layer, a third metal layer disposed below the second core layer, and a fourth metal layer disposed above the second core layer, wherein each of the first core layer and the second core layer is a single electrically insulative layer and wherein the first core layer and the second core layer have different thicknesses; and
    disposing the second core structure above the first core structure; and
    disposing one or more additional metal layers above the second core structure, wherein the antenna is configured to at least one of transmit or receive signals.

15. The method of claim 14, wherein disposing the second core structure above the first core structure comprises bonding the second core structure to the first core structure with a bonding material.

16. The method of claim 14, wherein a layer stack-up of the multi-core PCB structure is asymmetrical with respect to a horizontal axis through the center of the layer stack-up, the layer stack-up being a cross-section of all layers of the multi-core PCB structure.

17. The method of claim 14, wherein disposing the one or more additional metal layers comprises:
    laminating a fifth metal layer above the second core structure; and
    laminating a sixth metal layer above the fifth metal layer.

18. The method of claim 14, further comprising drilling a first drill hole through the first core layer.

19. The method of claim 18, further comprising drilling a second drill hole through the first core layer and the second core layer after disposing the second core structure above the first core structure.

20. The method of claim 19, further comprising filling at least one of the first drill hole or the second drill hole with a dielectric ink.

* * * * *